United States Patent
Ruckerbauer et al.

(10) Patent No.: US 7,222,271 B2
(45) Date of Patent: May 22, 2007

(54) METHOD FOR REPAIRING HARDWARE FAULTS IN MEMORY CHIPS

(75) Inventors: Hermann Ruckerbauer, Moos (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 405 days.

(21) Appl. No.: 10/133,795

(22) Filed: Apr. 26, 2002

(65) Prior Publication Data

US 2002/0188897 A1    Dec. 12, 2002

(30) Foreign Application Priority Data

Apr. 27, 2001  (DE) ................................. 101 20 670

(51) Int. Cl.
*G11C 29/00*    (2006.01)

(52) U.S. Cl. ........................................ 714/710; 714/763

(58) Field of Classification Search .............. 714/710, 714/718, 721, 764, 711, 763; 365/200
See application file for complete search history.

(56) References Cited

U.S. PATENT DOCUMENTS

| | | | | |
|---|---|---|---|---|
| 4,460,998 A | * | 7/1984 | Yamada et al. | ............. 714/711 |
| 4,939,694 A | | 7/1990 | Eaton et al. | |
| 5,058,059 A | * | 10/1991 | Matsuo et al. | ................. 365/96 |
| 5,134,616 A | * | 7/1992 | Barth et al. | .................. 714/711 |
| 5,764,577 A | * | 6/1998 | Johnston et al. | ............ 365/200 |
| 5,764,878 A | * | 6/1998 | Kablanian et al. | ............. 714/7 |
| 5,917,764 A | * | 6/1999 | Ohsawa et al. | ............. 365/200 |
| 5,920,515 A | * | 7/1999 | Shaik et al. | ................. 365/200 |
| 6,259,637 B1 | * | 7/2001 | Wood et al. | ................. 365/200 |
| 6,480,982 B1 | * | 11/2002 | Chan et al. | ................. 714/764 |
| 6,529,407 B2 | * | 3/2003 | Shukuri | ................. 365/185.07 |
| 6,611,458 B2 | * | 8/2003 | Ishibashi et al. | ....... 365/185.09 |

* cited by examiner

*Primary Examiner*—Albert Decady
*Assistant Examiner*—Mujtaba K. Chaudry
(74) *Attorney, Agent, or Firm*—Jenkins, Wilson, Taylor & Hunt, P.A.

(57) ABSTRACT

Method for repairing hardware faults in memory chips. According to one embodiment, a method is provided for repairing bit errors in memory chips having a multiplicity of memory cells. The method can include detecting bit errors using an error identification algorithm. Further, the method can include determining the addresses of faulty memory cells. The method can also include setting a data bit initiating a repair mode in response to detecting a bit error. In the repair mode, a signal present on a data line to the memory chips can be interpreted as a repair command to perform a repair. In addition, the method can include repairing the bit errors by activating redundant memory cells.

15 Claims, 1 Drawing Sheet

METHOD FOR REPAIRING HARDWARE FAULTS IN MEMORY CHIPS

TECHNICAL FIELD

The invention relates to a method for repairing hardware faults in memory chips in a data processing unit, with the repair being effected, in particular, with the end user of the unit.

BACKGROUND ART

In modern data processing systems, information needs to be processed, stored and read with as little error as possible. As memory size increases, the likelihood of an error rises, which in the worst case can result in the system crashing.

Memory chips, such as DRAMs, SRAMs or ROMs, are therefore tested precisely before they are installed in a finished product, such as a PC.

The memory chips can be checked for faults at several times in the memory chips' manufacturing process. A first test on the chips is normally effected at wafer level (the chip is still in the raw state and has not yet been inserted into a package), with faulty memory cells being identified and repaired by laser cutter, for example.

If the memory chip is already in a package, a fault can be located and repaired using a tester, for example. To this end, the chip needs to have redundant memory cells which are activated by means of e-fuses (electrically activatable fuses), for example.

The checking routines applied during the tests can never fully check a memory chip with certainty, however, and therefore have gaps. During normal operation of a DIMM module (DIMM: Dual Inline Memory Module), data combinations can therefore arise which provoke a fault. In this case, the end user has no way of locating and repairing faults.

It is known practice for data processing units to incorporate an error identification algorithm (ECC algorithm; ECC: Error Correction Code) which can identify and correct single-bit errors and possibly also multibit errors. In this case, however, error correction is performed exclusively using correction algorithms and leaves the actual cause of the error, namely the hardware fault in the chip, untouched.

SUMMARY OF THE INVENTION

It is therefore the object of the present invention to provide a method and a system which can be used to eliminate a hardware fault in a memory chip in the finished product (with the customer or end user).

The invention achieves this object by means of the features specified in patent claim 1. Further refinements of the invention are the subject matter of subclaims.

The fundamental inventive concept of the invention is that of locating a fault in the unit and of starting a repair mode in which memory cells which are not functioning in a chip are replaced by redundant memory cells, i.e. the hardware fault is repaired. The repair is effected with the end user of the unit.

The invention therefore proposes a method for repairing bit errors in memory chips having a multiplicity of memory cells, which comprises the following steps:

a bit error is detected using an error identification algorithm;

the address of the faulty memory cell(s) is determined;

the error is repaired by activating redundant memory cells, with the repair being effected in the installed state of the memory chip, particularly with the end user.

Said unit is preferably a data processing system having a CPU, a memory management unit, such as a chipset, and a plurality of memory chips which are installed in a DIMM module, for example.

The error identification algorithm used can identify single-bit errors and preferably also multibit errors. Such an algorithm is the Hamming code, for example. Other error identification algorithms can likewise be used, however.

An error message in the system can be based either on a soft error or on a hard error. A soft error is triggered by a one-off event, such as alpha radiation. By contrast, "hard errors" are genuine physical faults, which can arise as a result of degradation of the cell transistors (selection transistors), for example.

On the basis of the invention, hard errors should be repaired, whereas soft errors represent only a one-off random event and therefore do not require repair.

To distinguish between a soft error and a hard error, the address of the memory cell where an error has occurred is stored and is compared with newly arising error addresses. If an error occurs at the same address a further time, it can be assumed that there is a hard error.

To detect a hard error, it is advantageous, following the detection of a bit error, to run a memory test routine which preferably checks the memory area containing the faulty memory cell a further time.

In accordance with one preferred refinement of the invention, the addresses of faulty memory cells are stored in a nonvolatile memory. To this end, it is possible to provide an EEPROM, for example, in order to continue to have the data available even after the system is turned off.

Optionally, the address of the faulty memory cells is temporarily stored and the presence of a bit error is indicated to the user. The user can then run a test program and can also repair the memory chip.

In accordance with one specific refinement of the invention, the memory chip has a multiplicity of redundant memory cells which can preferably be activated by means of e-fuses (electrically activatable fuses or switches).

Following detection of a bit error and possibly a further check on the associated address, a repair mode is preferably started. In the repair mode, the faulty area of a memory chip is replaced by redundant cells to which the address of the faulty memory cells is assigned.

The repair mode can be initiated, by way of example, by setting a data bit, which is set in the extended mode register (EMR) of a DDR memory chip, for example. To repair the memory chip, by way of example, a standard command, preferably a write command, is used at a particular address of the memory chip. If a repair mode signal (e.g. set data bit in the EMR) and a write command are present, the memory chip performs a repair if a corresponding signal (e.g. a "1") is present on a data line in the memory chip. The combination of the write command and a set data bit is used to determine the address of the bit error on the memory module clearly.

The signal for performing a repair is preferably transferred via that data line on which the bit error has been indicated. All the other data lines are preferably deactivated in the repair mode.

The setting of a data bit in the memory chip, which signals a repair mode, serves in particular to save another repair command which would otherwise need to be transferred to the memory chip by the chipset via the command lines.

If it is possible to transmit a repair command to the memory chip via command and address lines, a repair can also be initiated by such a repair command. The memory chip is then preferably repaired automatically.

The result of the repair is preferably logged, stored at an address and can be read using another standard command, e.g. using a read command, when the repair bit is set (in the EMR).

The repair of a memory chip can, by way of example, be started and performed automatically. Alternatively, the user of the unit can be made aware of the error and can perform the repair under user control using a specific program, for example.

BRIEF DESCRIPTION OF THE DRAWING

The invention is explained in more detail below by way of example with reference to the appended drawing labeled FIG. 1.

DETAILED DESCRIPTION OF THE INVENTION

Figure 1:
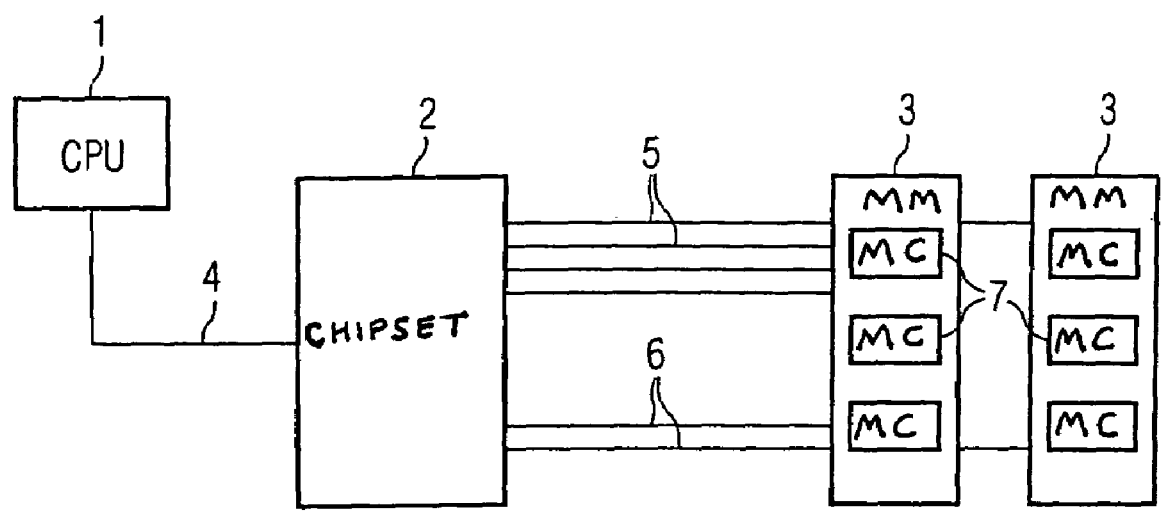
FIG. 1 shows a system having a CPU 1, a chipset 2 and a plurality of DIMM memory modules 3. The memory modules 3 in turn comprise a plurality of memory chips 7 (DRAMs).

Each memory chip 7 is provided with separate data lines 5 which can be used to transfer the data from and to the chipset 2. Commands and addresses are transferred via corresponding command and address lines 6.

The address contents are checked by an ECC algorithm. If a data error occurs which is identified by the chipset 2, a repair mode is started and the appropriate memory chip is repaired.

The repair is initiated by setting a repair bit which is preferably stored in the mode or extended mode register of the memory chip. A write command is then sent to the chip's error address, and the faulty chip interprets it as a repair command if there is a signal on a data line.

The repair signal is preferably transferred via that data line on which the bit error has been indicated. All the other data lines are preferably deactivated in the repair mode.

Optionally, the repair can also be initiated by sending a separate repair command via the address and data lines 6.

The repair is then performed automatically or under user control, with faulty memory cells being replaced by redundant cells.

The result of the repair is preferably logged and can be read. If the repair has not been successful, the operation can be repeated. Following a successful repair, the repair mode data bit which was set is reset again.

LIST OF REFERENCE NUMERALS

| | |
|---|---|
| 1 | CPU |
| 2 | Chipset |
| 3 | Memory modules |
| 4 | Data bus |
| 5 | Data lines |
| 6 | Command and address lines |

What is claimed is:

1. A method for repairing bit errors in memory chips having a multiplicity of memory cells, the method comprising:
    (a) detecting bit errors using an error identification algorithm;
    (b) determining the addresses of faulty memory cells;
    (c) in response to detecting a bit error, setting a data bit initiating a repair mode;
    (d) in the repair mode, interpreting a signal present on one of a plurality of data lines to the memory chips as repair command to perform a repair;
    (e) repairing the bit errors by activating redundant memory cells, with the repair being effected in an installed state of the memory chip; and
    (f) in a system having a plurality of memory chips, deactivating the data lines to the memory chips which are not faulty in the repair mode, wherein only the data line to the faulty memory chip, on which line an error has been indicated, is active.

2. A method according to claim 1, wherein, in the installed state, the memory chips are mounted permanently on a support or on a base and are integrated in a data processing unit.

3. A method according to claim 1, wherein the memory chips are arranged in a system, comprising a CPU, a memory management unit and a plurality of the memory chips.

4. A method according to claim 1, wherein the error identification algorithm is suitable for detecting single-bit errors and/or multibit errors.

5. A method according to claim 1, comprising utilizing a Hamming code for error identification.

6. A method according to claim 1, comprising storing the address of a faulty memory cell in a nonvolatile memory.

7. A method according to claim 1, comprising temporarily storing the address of a faulty memory cell and comprising indicating the presence of an error to the user.

8. A method according to claim 1, comprising executing a memory test program.

9. A method according to claim 1, comprising activating redundant memory cells by means of e-fuses.

10. A method according to claim 1, comprising checking a further a memory cell in which a bit error has occurred in order to distinguish between a soft error and a hard error.

11. A method according to claim 1, wherein the data bit which signals the repair mode is stored in a register, particularly in the mode register of the memory chip.

12. A method according to claim 1, wherein the repair mode is started automatically.

13. A method according to claim 1, comprising indicating the occurrence of a bit error to a user, after which error correction is performed using a program.

14. A method according to claim 9, comprising, to produce a relatively high voltage required for the e-fuses, providing charge pumps which are fed from an external source.

15. A method according to claim 1, wherein a repair is followed by logging whether the repair was successful.

* * * * *